(12) United States Patent
Kubota et al.

(10) Patent No.: US 9,054,311 B2
(45) Date of Patent: Jun. 9, 2015

(54) ELECTRONIC DEVICE AND METHOD OF MANUFACTURING THE SAME

(71) Applicant: FUJITSU LIMITED, Kawasaki-shi, Kanagawa (JP)

(72) Inventors: Hajime Kubota, Kawasaki (JP); Masayuki Itoh, Kawasaki (JP); Masakazu Kishi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 17 days.

(21) Appl. No.: 14/029,869

(22) Filed: Sep. 18, 2013

(65) Prior Publication Data

US 2014/0183672 A1 Jul. 3, 2014

(30) Foreign Application Priority Data

Dec. 28, 2012 (JP) ................................ 2012-287542

(51) Int. Cl.
*H04R 23/00* (2006.01)
*H01L 41/313* (2013.01)
*H03H 9/05* (2006.01)
*H03H 9/10* (2006.01)
*H03H 3/02* (2006.01)

(52) U.S. Cl.
CPC ........... *H01L 41/313* (2013.01); *H03H 9/0519* (2013.01); *H03H 9/1021* (2013.01); *H03H 2003/022* (2013.01)

(58) Field of Classification Search
None
See application file for complete search history.

(56) References Cited

U.S. PATENT DOCUMENTS 7,112,914 B1 * 9/2006 Dalla Piazza et al. ........ 310/348

FOREIGN PATENT DOCUMENTS

| JP | 05-191190 A | 7/1993 |
| JP | 09-167934 A | 6/1997 |
| JP | 2008-166884 A | 7/2008 |
| JP | 2010-187133 A | 8/2010 |

* cited by examiner

*Primary Examiner* — Yasser A Abdelaziez
(74) *Attorney, Agent, or Firm* — Squire Patton Boggs (US) LLP (57) ABSTRACT

An electronic device includes: a first-member that includes a through-hole; a second-member that includes a connection-hole and that is in contact with the first-member in a state where the through-hole and the connection-hole are in communication with each other; a first-locking-surface that is formed on the first-member while extending radially outside of the through-hole and that faces a side opposite to the connection-hole-side; a second-locking-surface that is formed in the second-member while extending radially outside of the connection-hole and that faces a side opposite to the through-hole-side; and an adhesive-portion including a shaft-portion with which the through-hole and the connection-hole are filled, a first-large-diameter portion that is formed at an end of the shaft-portion and secured to the first-locking-surface, and a second-large-diameter portion that is formed at the other end of the shaft-portion and secured to the second-locking-surface.

15 Claims, 7 Drawing Sheets

ELECTRONIC DEVICE AND METHOD OF MANUFACTURING THE SAME

CROSS-REFERENCE TO RELATED APPLICATION

This application is based upon and claims the benefit of priority of the prior Japanese Patent Application No. 2012-287542, filed on Dec. 28, 2012, the entire contents of which are incorporated herein by reference.

FIELD

The embodiments discussed herein are related to an electronic device and a method of manufacturing an electronic device.

BACKGROUND

In the related art, an electronic device that includes a first member such as a piezoelectric vibrating reed and a second member such as a package is known.

Japanese Laid-open Patent Publication Nos. 05-191190, 2010-187133, 09-167934, 2008-166884 are examples of the related art.

In such an electronic device, it may sometimes be desired to improve the strength with which a first member and a second member are fixed to each other.

SUMMARY

According to an aspect of the invention, An electronic device includes: a first-member that includes a through-hole; a second-member that includes a connection-hole and that is in contact with the first-member in a state where the through-hole and the connection-hole are in communication with each other; a first-locking-surface that is formed on the first-member while extending radially outside of the through-hole and that faces a side opposite to the connection-hole-side; a second-locking-surface that is formed in the second-member while extending radially outside of the connection-hole and that faces a side opposite to the through-hole-side; and an adhesive-portion including a shaft-portion with which the through-hole and the connection-hole are filled, a first-large-diameter portion that is formed at an end of the shaft-portion and secured to the first-locking-surface, and a second-large-diameter portion that is formed at the other end of the shaft-portion and secured to the second-locking-surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

First, a first embodiment of a technique disclosed in the present application will be described.

Figure 1:
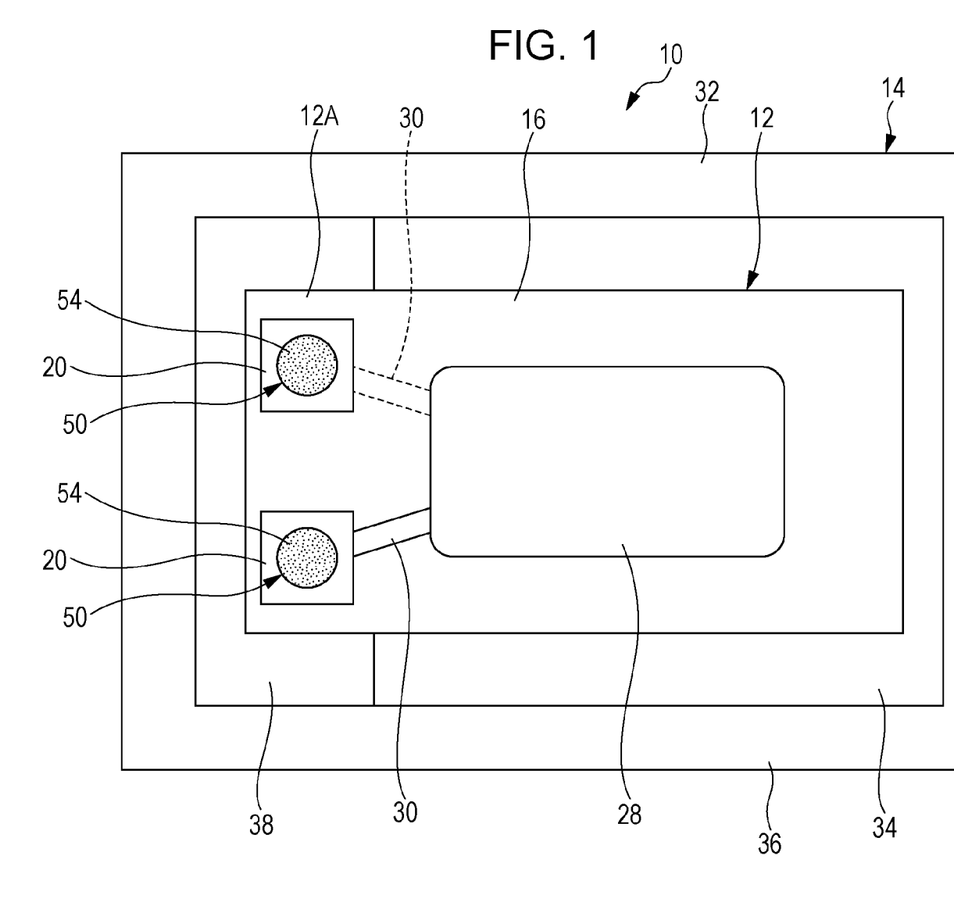
FIG. 1 is a plan view of an electronic device according to a first embodiment.
Figure 2:
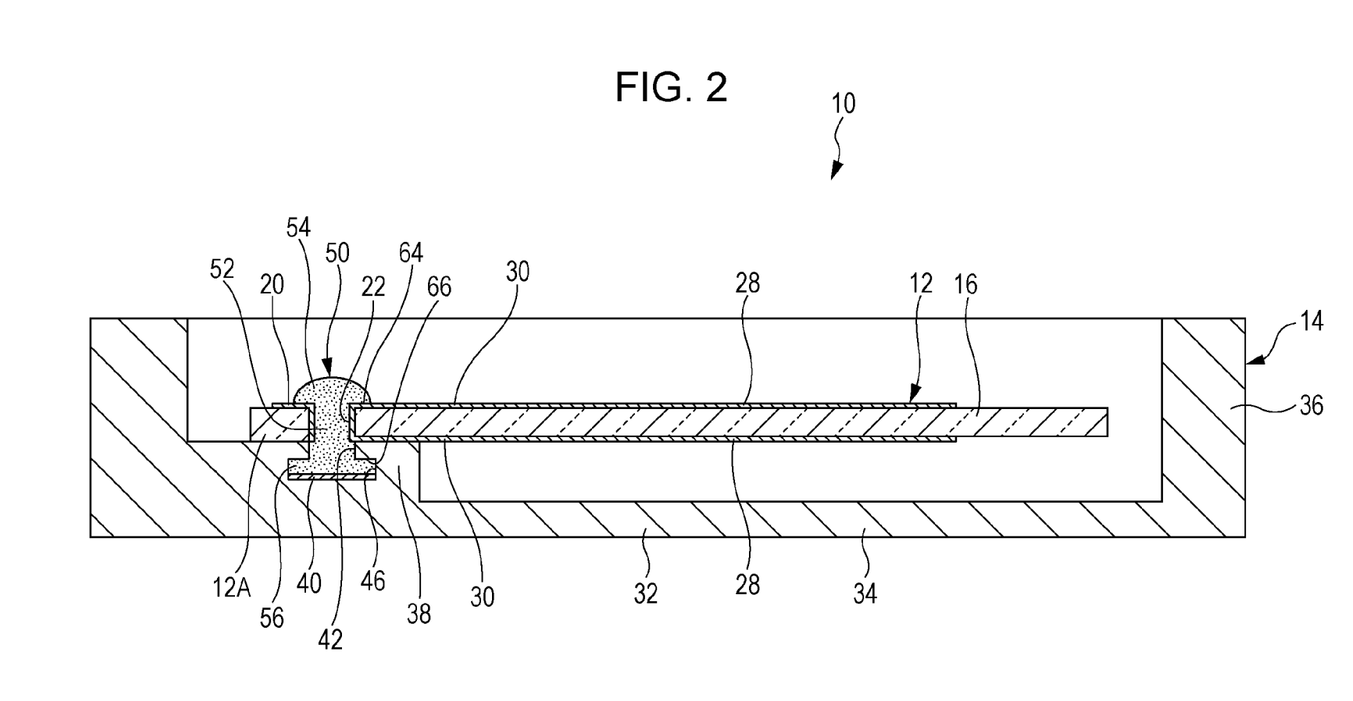
FIG. 2 is a sectional side view of the electronic device according to the first embodiment.

An electronic device 10 according to the first embodiment that is illustrated in FIG. 1 and FIG. 2 is a piezoelectric vibration device as an example. The electronic device 10 includes a piezoelectric vibrating reed 12 that is an example of a first member and a package 14 that is an example of a second member.

Figure 3:
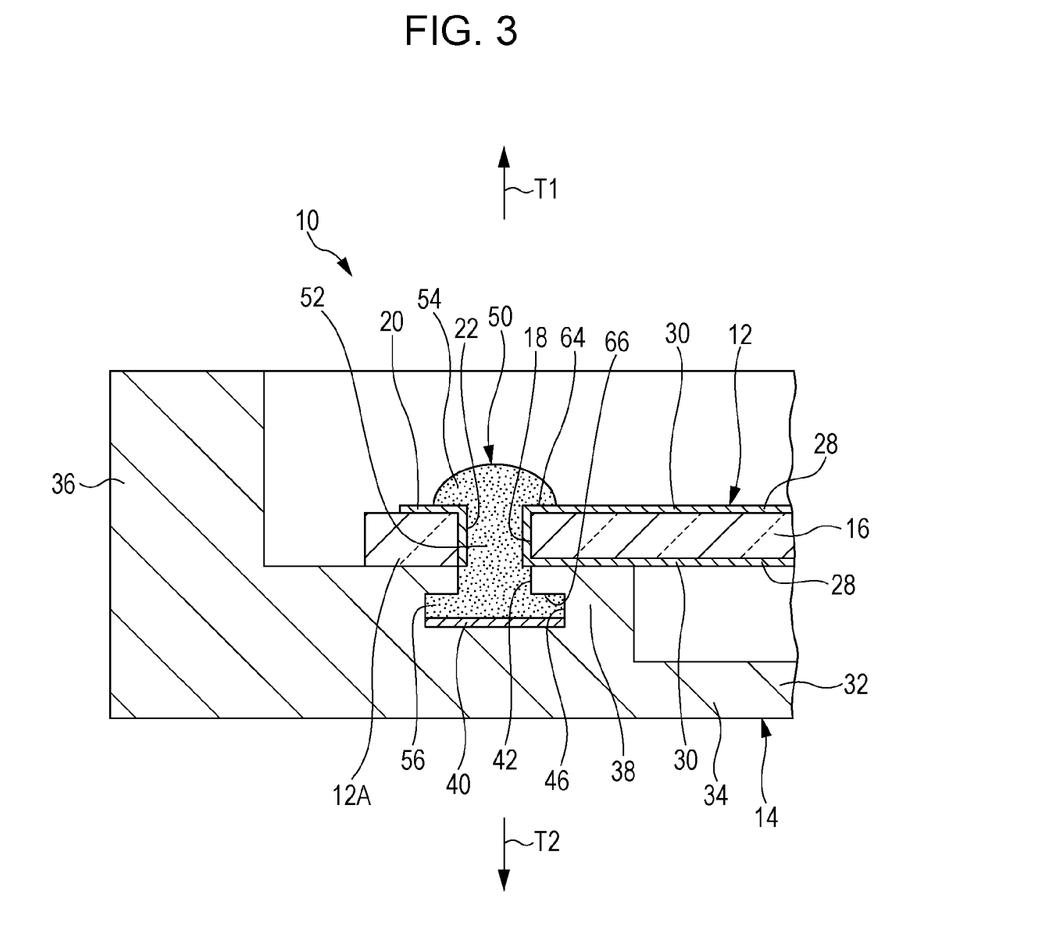
FIG. 3 is an enlarged view of a principal portion of FIG. 2.

The piezoelectric vibrating reed 12 includes a substrate 16 that is made of glass. The substrate 16 is formed in a rectangular shape in plan view. As illustrated in FIG. 3, holes 18 extending through the substrate 16 in the thickness direction of the substrate 16 are formed on one end side of the substrate 16 in the longitudinal direction of the substrate 16. A first electrode 20 in the form of a thin film is formed on the inner circumferential surface of each of the holes 18 and the circumferential edge portion of an opening of each of the holes 18 in the front surface of the substrate 16 by, for example, evaporation or the like. A through hole 22 extending through the substrate 16 in the thickness direction of the substrate 16 is formed in each of areas surrounded by the corresponding first electrodes 20. Each of the first electrodes 20 is arranged coaxially with the corresponding through hole 22.

As illustrated in FIG. 1, the first electrodes 20 and the corresponding through holes 22 are formed at two positions that are separated from each other in the lateral direction of the substrate 16. As illustrated in FIG. 2, excitation electrodes 28 and wiring portions 30 are formed on the front surface and the rear surface of the substrate 16. The excitation electrode 28 that is formed on the front surface of the substrate 16 is connected to one of the first electrodes 20 via the wiring portion 30 that is formed on the front surface of the substrate 16. On the other hand, the excitation electrode 28 that is formed on the rear surface of the substrate 16 is connected to the other one of the first electrodes 20 via the wiring portion 30 that is formed on the rear surface of the substrate 16.

The package 14 includes a base member 32 made of silicon. The base member 32 includes a bottom part 34 and a surrounding wall part 36 that is formed around the periphery of the bottom part 34. The bottom part 34 is formed in a rectangular shape larger than the above-described piezoelectric vibrating reed 12 in plan view. A base part 38 is formed on one end side of the bottom part 34 in the longitudinal direction of the bottom part 34. As illustrated in FIG. 3, connection holes 42 and transverse grooves 46 are formed in the base part 38.

Each of the connection holes 42 is open to the top surface of the base part 38, and each of the transverse grooves 46 is formed at an end of a corresponding one of the connection holes 42 on the opposite side to the side of the opening of the connection hole 42. Each of the transverse grooves 46 extends radially outside of the corresponding connection hole 42 and is formed in a ring shape along the entire circumference of the connection hole 42 in the circumferential direction of the connection hole 42. The connection holes 42 and the transverse grooves 46 are formed by, for example, dry etching, photoetching, or the like. Among the inner wall surfaces of each of the transverse grooves 46, on the surface on the opposite side to the side of the corresponding connection hole 42, a second electrode 40 that is in the form of a thin film is formed by, for example, evaporation or the like. The second electrodes 40 are arranged coaxially with the corresponding connection holes 42.

A portion 12A of the above-described piezoelectric vibrating reed 12 on the side of the first electrodes 20 is in contact (superposed) with the top surface of the base part 38 in such a manner that each of the through holes 22 and a corresponding one of the connection holes 42 are in communication with each other. The portion 12A of the piezoelectric vibrating reed 12 on the side of the first electrodes 20 is fixed to the base part 38 with the following structure in which adhesive portions 50 are used.

In other words, the circumferential edge portion of the opening of each of the through holes 22 on the opposite side to the side of the corresponding connection hole 42 is formed as a first locking surface 64. Each of the first locking surfaces 64 is formed on the piezoelectric vibrating reed 12, extends radially outside of the corresponding through hole 22, and faces a side (the side of arrow T1) opposite to the side of the corresponding connection hole 42. On the other hand, among the inner wall surfaces of each of the transverse grooves 46 extending radially outside of the corresponding connection holes 42, the surface that faces the corresponding second electrode 40 is formed as a second locking surface 66. Each of the second locking surfaces 66 is formed in the package 14, extends radially outside of the corresponding connection hole 42, and faces a side (the side of arrow T2) opposite to the side of the corresponding through hole 22.

Each of the adhesive portions 50 integrally includes a shaft portion 52, a first large diameter portion 54, and a second large diameter portion 56. Among an adhesive that forms the adhesive portions 50, parts of the adhesive with which the through holes 22 and the connection holes 42 are filled correspond to the shaft portions 52. Each of the first large diameter portions 54 is formed at one end of the corresponding shaft portion 52. Parts of the adhesive, which forms the adhesive portions 50, that protrude out from the openings of the through holes 22 on the opposite side to the side of the connection holes 42 correspond to the first large diameter portions 54. Each of the second large diameter portions 56 is formed at the other end of the corresponding shaft portion 52. Parts of the adhesive, which forms the adhesive portions 50, with which the transverse grooves 46 are filled correspond to the second large diameter portions 56. Each of the first large diameter portions 54 and each of the second large diameter portions 56 are formed in such a manner as to have a larger diameter than that of the corresponding shaft portion 52.

In a state where the adhesive, which forms the adhesive portions 50, is cured, each of the first large diameter portions 54 is secured to a corresponding one of the first locking surfaces 64, and each of the second large diameter portions 56 is secured to a corresponding one of the second locking surfaces 66. The first large diameter portions 54 and the second large diameter portions 56, respectively, are secured to the corresponding first locking surfaces 64 and the corresponding second locking surfaces 66 in this manner, so that the portion 12A of the piezoelectric vibrating reed 12 on the side of the first electrodes 20 is fixed to the base part 38 of the package 14.

The above-described adhesive portions 50 have conductivity. In each of the adhesive portions 50, a portion of the shaft portion 52 on the side of a corresponding one of the first large diameter portions 54 and the first large diameter portion 54 are in contact with a corresponding one of the first electrodes 20. In each of the adhesive portions 50, the second large diameter portion 56 is in contact with a corresponding one of the second electrodes 40. Each of the first electrodes 20 and a corresponding one of the second electrodes 40 are electrically connected to each other via the adhesive portions 50.

Next, a method of manufacturing the electronic device 10 according to the first embodiment will be described.

First, the piezoelectric vibrating reed 12 that includes the substrate 16, the first electrodes 20, the through holes 22, the excitation electrodes 28, and the wiring portions 30 is manufactured. The package 14 that includes the base member 32, the second electrodes 40, the connection holes 42, and the transverse grooves 46 is also manufactured.

Figure 4:
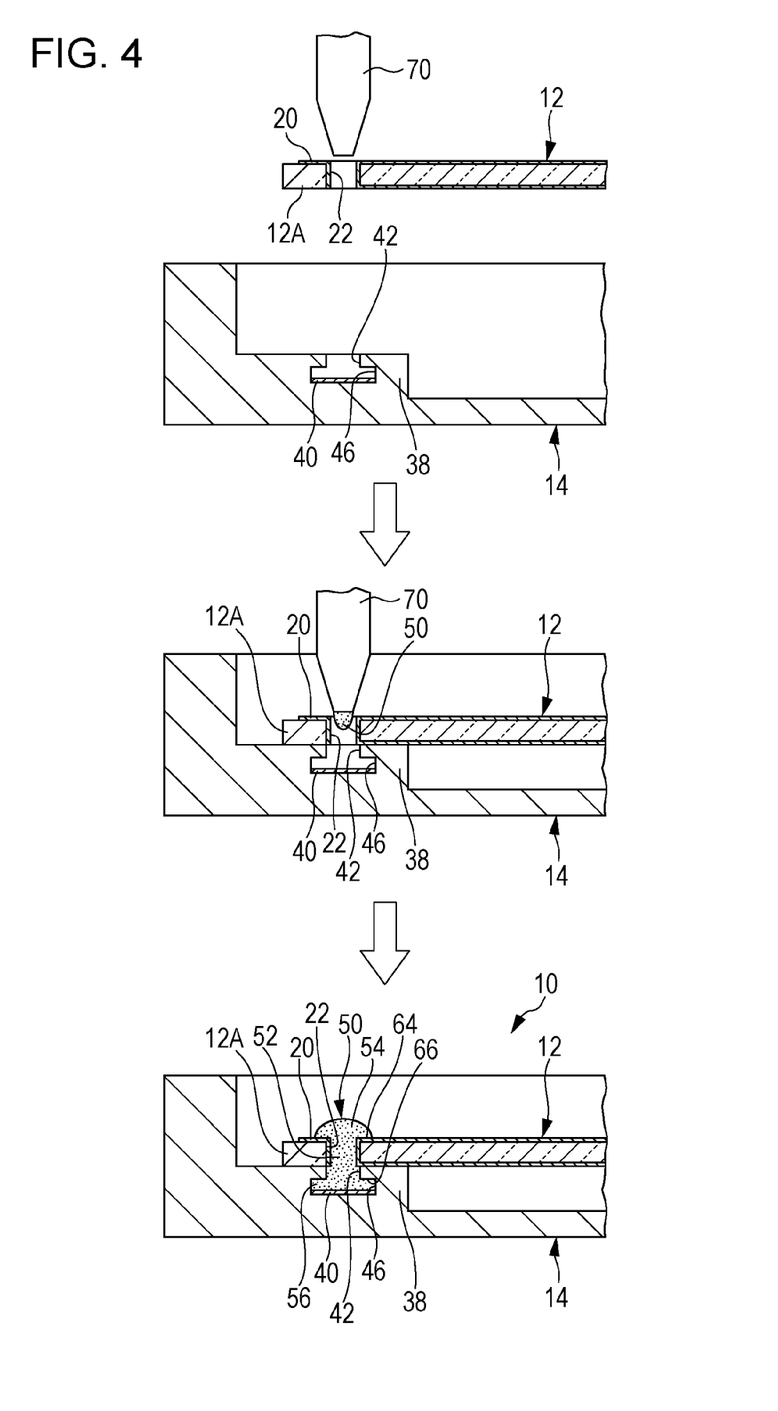
FIG. 4 is a diagram describing a method of manufacturing the electronic device according to the first embodiment.

After that, as illustrated in the upper figure of FIG. 4, a nozzle 70 that supplies the adhesive, which forms the adhesive portions 50, is positioned above the opening of one of the through holes 22 on the opposite side to the side of the corresponding connection hole 42. Then, as illustrated in the middle figure of FIG. 4, the nozzle 70 and the piezoelectric vibrating reed 12 are relatively brought closer to the package 14, and the portion 12A of the piezoelectric vibrating reed 12 on the side of the first electrodes 20 and the top surface of the base part 38 are brought into contact with each other in such a manner that the through holes 22 and the corresponding connection holes 42 are in communication with one another.

Next, as illustrated in the middle figure of FIG. 4, the adhesive, which forms the adhesive portions 50, is injected into the through holes 22 and the connection holes 42 from the nozzle 70 via the openings of the through holes 22 on the opposite side to the side of the connection holes 42. In this case, part of the adhesive, which forms the adhesive portions 50, is injected into the transverse grooves 46 in such a manner that the transverse grooves 46 are filled with the adhesive, and the other part of the adhesive, which forms the adhesive portions 50, protrudes out from the openings of the through holes 22 on the opposite side to the side of the connection holes 42.

Then, the adhesive, which forms the adhesive portions 50, is cured, so that the shaft portions 52, the first large diameter portions 54, and the second large diameter portions 56 of each of the adhesive portions 50 are formed. The first large diameter portions 54 and the second large diameter portions 56, which have been formed in this manner, are secured to the corresponding first locking surfaces 64 and the corresponding second locking surfaces 66, respectively, so that the portion 12A of the piezoelectric vibrating reed 12 on the side of the first electrodes 20 is fixed to the base part 38. The electronic device 10 is completed through other mounting processes, an inspection process, and the like.

Next, advantageous effects of the first embodiment will be described.

As described in detail above, according to the first embodiment (see FIG. 3), the first locking surfaces 64 each of which extends radially outside of the corresponding through hole 22 and each of which faces the side (the side of arrow T1) opposite to the side of the corresponding connection hole 42 are formed on the piezoelectric vibrating reed 12. On the other hand, the second locking surfaces 66 each of which extends radially outside of the corresponding connection hole 42 and each of which faces the side (the side of arrow T2) opposite to the side of the corresponding through hole 22 are formed on the package 14. Each of the adhesive portions 50 includes the first large diameter portion 54 and the second large diameter portion 56. The first large diameter portions 54 and the second large diameter portions 56 are secured to the corresponding first locking surfaces 64 and the corresponding second locking surfaces 66, respectively. Therefore, each of the adhesive portions 50 is formed into a rivet shape as a result of including the first large diameter portion 54 and the second large diameter portion 56, and the piezoelectric vibrating reed 12 is fixed to the package 14 with the adhesive portions 50, each of which has been formed in a rivet shape. As a result, the strength with which the piezoelectric vibrating reed 12 and the package 14 are fixed to each other may be improved.

In particular, according to the first embodiment, since each of the adhesive portions 50 is formed into a rivet shape, even if the sizes of the through holes 22 and the connection holes 42 are reduced, the strength with which the piezoelectric vibrating reed 12 and the package 14 are fixed to each other may be improved.

In addition, as described above (see FIG. 4), In a state where the nozzle 70, which supplies the adhesive, which forms the adhesive portions 50, is positioned above the opening of one of the through holes 22 on the opposite side to the side of the corresponding connection hole 42, the nozzle 70 and the piezoelectric vibrating reed 12 may be relatively brought closer to the package 14. Therefore, when the piezoelectric vibrating reed 12 and the package 14 are positioned with respect to each other, the nozzle 70 and the package 14 are also positioned with respect to each other, and thus, the workload of the positioning process may be reduced.

In other words, if an adhesive is applied to the package 14 from the nozzle 70, and after that, the piezoelectric vibrating reed 12 and the package 14 are fixed to each other, both positioning of the nozzle 70 and the package 14 and positioning of the piezoelectric vibrating reed 12 and the package 14 are performed. However, according to the first embodiment, as described above, only the positioning of the piezoelectric vibrating reed 12 and the package 14 is performed, and thus, the workload of the positioning process may be reduced.

Each of the first electrodes 20 is arranged coaxially with the corresponding through hole 22, and each of the second electrodes 40 is arranged coaxially with the corresponding connection hole 42. Therefore, the periphery of each of the first electrodes 20 and the periphery of the corresponding second electrode 40 may be bonded together with the adhesive, which forms the adhesive portions 50 and with which the corresponding through hole 22 and the corresponding connection hole 42 are filled, and thus, the connection state of each of the first electrodes 20 and the corresponding second electrode 40 may be stabilized.

Next, modifications of the first embodiment will be described.

In the above-described first embodiment, each of the first locking surfaces 64 is formed in the circumferential edge portion of the opening of the corresponding through hole 22 on the opposite side to the side of the corresponding connection hole 42. However, each of the first locking surfaces 64 may be formed as follows. In other words, in the modification illustrated in FIG. 5, transverse grooves 26 are formed in the piezoelectric vibrating reed 12. Each of the transverse grooves 26 extends radially outside of a corresponding one of the through holes 22 from an end of the through hole 22 on the opposite side to the side of the corresponding connection hole 42. Each of the transverse grooves 26 is formed in a ring shape along the entire circumference of the corresponding through hole 22 in the circumferential direction of the through hole 22.

Figure 5:
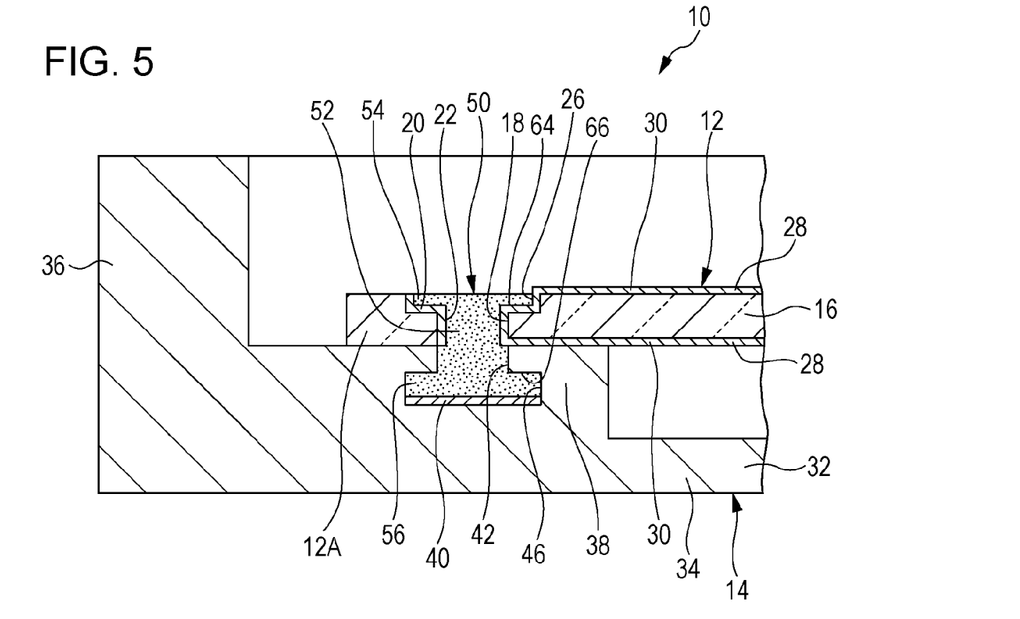
FIG. 5 is a diagram illustrating a first modification of the electronic device according to the first embodiment.

The inner wall surfaces of each of the transverse grooves 26 are formed of a corresponding one of the first electrodes 20. Among the inner wall surfaces of each of the transverse grooves 26, the surface that faces a side opposite to the side of the corresponding connection hole 42 is formed as the first locking surface 64. Even in such a configuration, each of the first large diameter portions 54 is secured to the corresponding first locking surface 64, and thus, the strength with which the piezoelectric vibrating reed 12 and the package 14 are fixed to each other may be improved.

In the above-described first embodiment, although the end portion of each of the connection holes 42 on the opposite side to the side of the corresponding through hole 22 is terminated, each of the end portions may be open.

Figure 6:
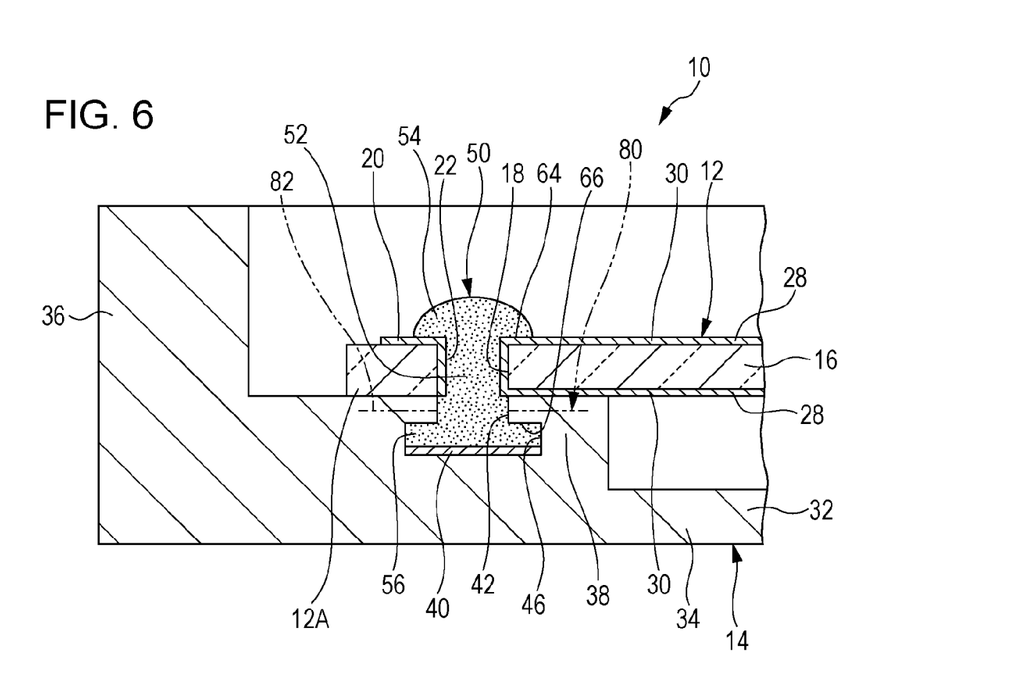
FIG. 6 is a diagram illustrating a second modification of the electronic device according to the first embodiment.
Figure 7:
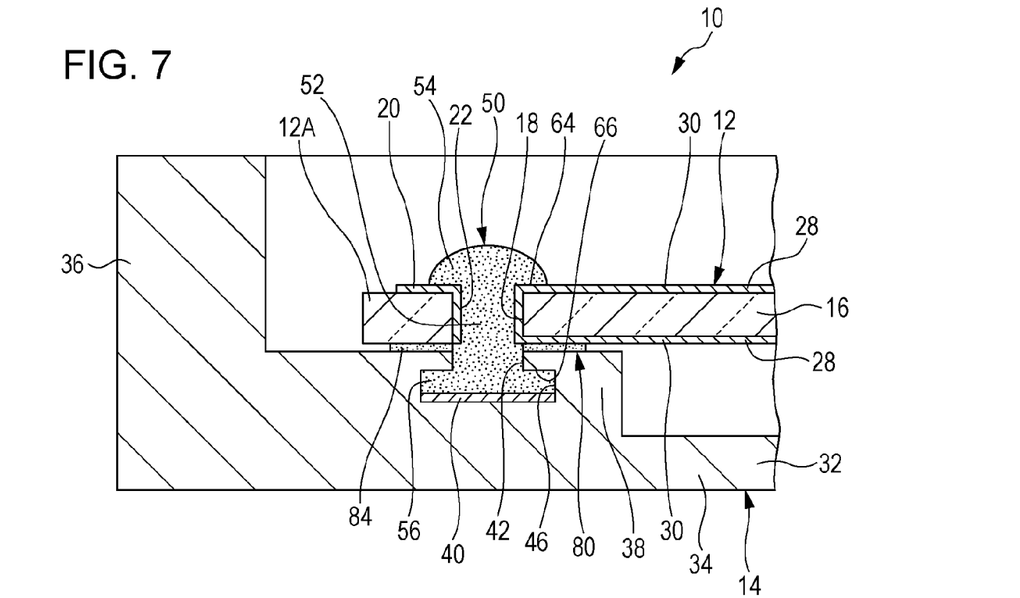
FIG. 7 is a diagram illustrating a third modification of the electronic device according to the first embodiment.

As illustrated in FIG. 6 and FIG. 7, the circumferential edge portion of an opening of each of the through holes 22 on the side of the corresponding connection hole 42 may be fixed to the circumferential edge portion of an opening of the corresponding connection hole 42 on the side of the through hole 22 with a tentative fixing part 80. In this configuration, when the adhesive, which forms the adhesive portions 50, is injected into the through holes 22 and the connection holes 42 from the above-mentioned nozzle 70 (see FIG. 4), occurrence of leakage of the adhesive, which forms the adhesive portions 50 and which is conductive, from the boundary between the piezoelectric vibrating reed 12 and the package 14 may be suppressed. As a result, occurrence of a short caused by the adhesive, which forms the adhesive portions 50, may be suppressed.

Note that, as illustrated in FIG. 6, the tentative fixing parts 80 may be anodically-bonded portions 82. Alternatively, as illustrated in FIG. 7, the tentative fixing parts 80 may be adhesive portions 84 that are different from the adhesive portions 50. The anodically-bonded portions 82 or the other adhesive portions 84 are used as the tentative fixing parts 80 in the case where a material suitable for the anodically-bonded portions 82 or the other adhesive portions 84 is used in the substrate 16 and the base member 32.

It is further preferable that an adhesive that has a viscosity lower than that of the adhesive, which forms the adhesive portions 50, in a state of being uncured be used as an adhesive that forms the other adhesive portions 84. In the case where an adhesive that has a low viscosity is used as the adhesive, which forms the other adhesive portions 84, as described above, when the portion 12A of the piezoelectric vibrating reed 12 on the side of the first electrodes 20 and the top surface of the base part 38 are brought into contact with each other, occurrence of flowing out of the adhesive, which forms the other adhesive portions 84, may be suppressed.

Furthermore, it is further preferable that the other adhesive portions 84 have an insulating property. With this configuration, the insulating properties of portions in which the through holes 22 and the corresponding connection holes 42 are connected to one another may be secured.

As described above, the piezoelectric vibrating reed 12 and the package 14 are fixed to each other with the adhesive portions 50 each of which is formed in a rivet shape. Therefore, the above-described tentative fixing parts 80 may be formed such that the reliability of each of the tentative fixing parts 80 against aging, temperature variation, and impact is not secured. In other words, in the case where the anodically-bonded portions 82 are used as the tentative fixing parts 80, the processing temperature may be set low, and the processing time may be decreased. As a result, stresses generated in the piezoelectric vibrating reed 12 and the package 14 may be reduced. In the case where the other adhesive portions 84 are used as the tentative fixing parts 80, the amount of the adhesive, which forms the other adhesive portions 84 may be reduced. As a result, the manufacturing costs may be reduced.

In the above-described first embodiment, the base member 32 of the package 14 may be made of a transparent material (e.g., a transparent ceramic or the like). With this configuration, the states of the connection holes 42 and the transverse grooves 46 that are being filled with the adhesive, which forms the adhesive portions 50, may be easily recognized.

Figure 8:
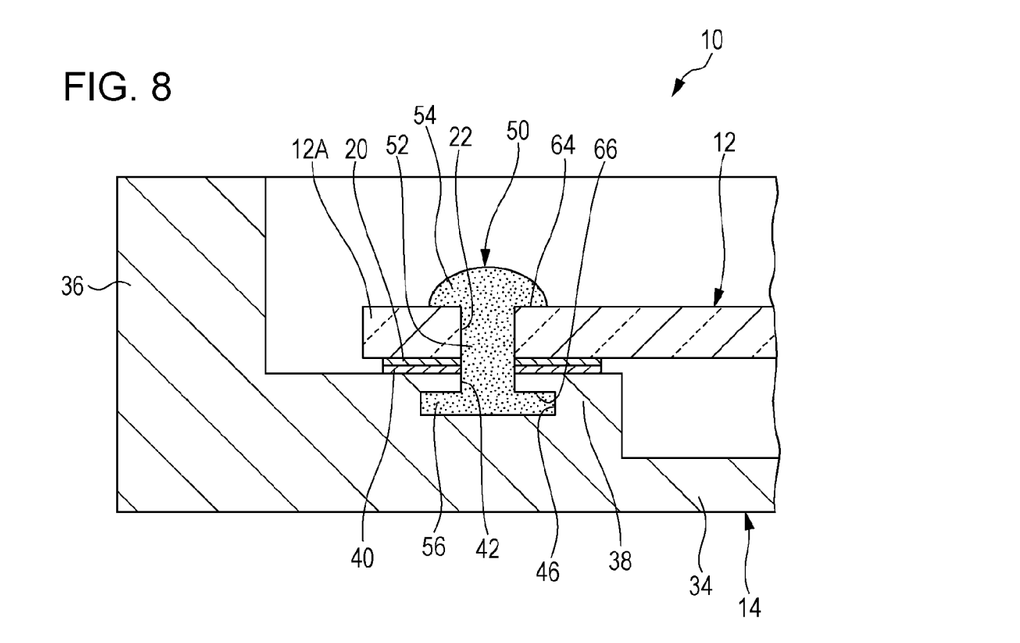
FIG. 8 is a diagram illustrating a fourth modification of the electronic device according to the first embodiment.

As illustrated in FIG. 8, in the above-described first embodiment, each of the first electrodes 20 may be formed in the circumferential edge portion of the opening of the corresponding through hole 22 on the side of the corresponding connection hole 42. In addition, each of the second electrodes 40 may be formed in the circumferential edge portion of the opening of the corresponding connection hole 42 on the side of the corresponding through hole 22. Furthermore, each of the first electrodes 20 and the corresponding second electrode 40 may be directly bonded to each other. Note that, in this case, it is preferable that the adhesive portions 50 have an insulating property. In the case of such a configuration, occurrence of separation of each of the first electrodes 20 and the corresponding second electrode 40 may be suppressed by the adhesive portions 50 each of which is formed in a rivet shape.

Note that a plurality of the modifications, which have been described above, may be suitably combined and employed.

Second Embodiment

A second embodiment of the technique disclosed in the present application will now be described.

Figure 9:
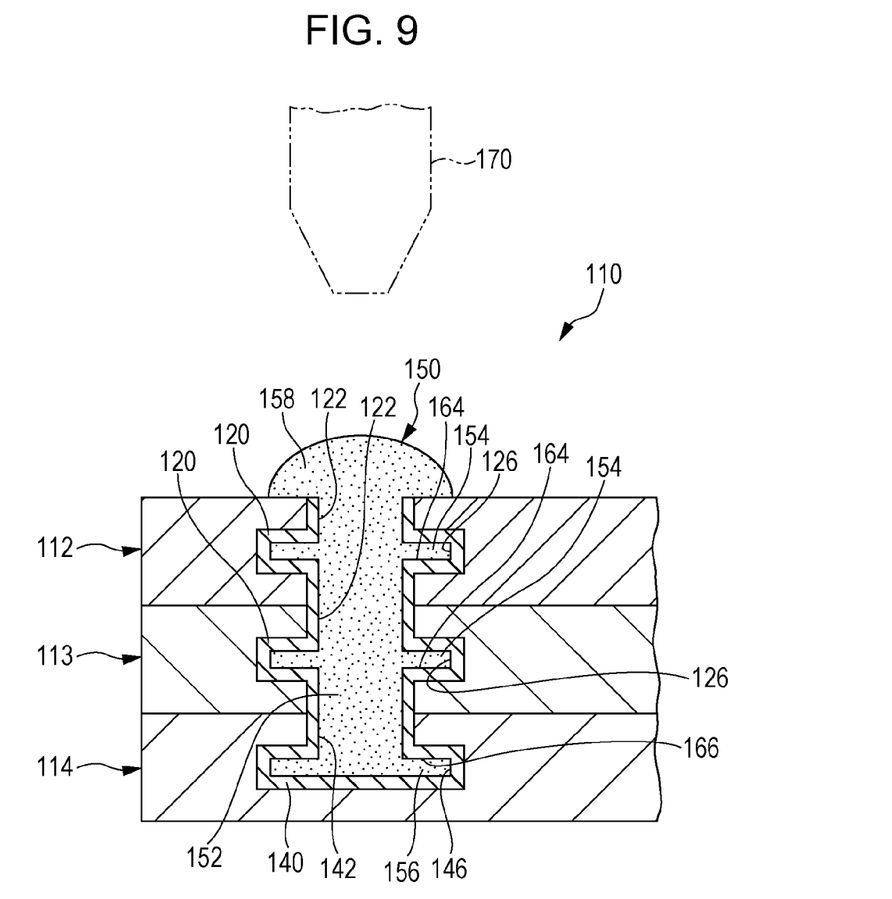
FIG. 9 is a sectional side view of an electronic device according to a second embodiment.

An electronic device 110 according to the second embodiment that is illustrated in FIG. 9 is a semiconductor device as an example. The electronic device 110 includes semiconductor integrated circuit elements 112 and 113 each of which is an example of a first member and a semiconductor integrated circuit element 114 that is an example of a second member.

First electrodes 120 and through holes 122 are formed in each of the semiconductor integrated circuit elements 112 and 113, which are the upper and the middle semiconductor integrated circuit elements, like the piezoelectric vibrating reed 12 in the above-described first embodiment (see FIG. 3). Second electrodes 140, connection holes 142, and transverse grooves 146 are formed in the semiconductor integrated circuit element 114, which is the lower semiconductor integrated circuit element, like the package 14 in the above-described first embodiment (see FIG. 3).

The upper and middle semiconductor integrated circuit elements 112 and 113 are superposed with each other in such a manner that a plurality of the through holes 122 formed in the semiconductor integrated circuit element 112 and a corresponding plurality of the through holes 122 formed in the semiconductor integrated circuit element 113 are in communication with one another. The lower semiconductor integrated circuit element 114 is superposed with the plurality of semiconductor integrated circuit elements 112 and 113 in a state where each of the connection holes 142 and a corresponding one of the plurality of the through holes 122 formed in the semiconductor integrated circuit element 113 are in communication with each other.

Transverse grooves 126 are formed in each of the upper and middle semiconductor integrated circuit elements 112 and 113. Each of the transverse grooves 126 extends radially outside of the corresponding through hole 122 from an intermediate portion of the through hole 122 in the axial direction of the through hole 122. Each of the transverse grooves 126 is formed in a ring shape along the entire circumference of the corresponding through hole 122 in the circumferential direction of the corresponding through hole 122.

The inner circumferential surfaces of each of the through holes 122 and the inner wall surfaces of each of the transverse grooves 126 are formed of a corresponding one of the first electrodes 20 that are formed by evaporation or the like. Similarly, the inner circumferential surfaces of each of the connection holes 142 and the inner wall surfaces of each of the transverse grooves 146 are formed of a corresponding one of the second electrodes 140 that are also formed by evaporation or the like. Among the inner wall surfaces of each of the transverse grooves 126, the surface that faces a side opposite to the side of the corresponding connection hole 142 is formed as a first locking surface 164. Among the inner wall surfaces of each of the transverse grooves 146, the surface that faces a side opposite to the side of the corresponding through hole 122 is formed as a second locking surface 166.

Adhesive portions 150 each include a shaft portion 152, a plurality of first large diameter portions 154, and a second large diameter portion 156. Among an adhesive that forms the adhesive portions 150, parts of the adhesive that form the plurality of first large diameter portions 154 are injected into a plurality of the transverse grooves 126 in such a manner that the transverse grooves 126 are filled with the adhesive, and each of the first large diameter portions 154 is secured to a corresponding one of the first locking surfaces 164. Parts of the adhesive that form the second large diameter portions 156 are injected into the transverse grooves 146 in such a manner that the transverse grooves 146 are filled with the adhesive, and each of the second large diameter portions 156 is secured to a corresponding one of the second locking surfaces 166.

In addition, each of the adhesive portions 150 includes a head portion 158. Each of the head portions 158 is secured to the circumferential edge portion of an opening of a corresponding one of the through holes 122 on the opposite side to the side of the corresponding connection hole 142. Note that, in the case where each of the adhesive portions 150 includes the head portion 158, each of the head portions 158 may be recognized as an example of a first large diameter portion. In addition, the circumferential edge portion of the opening of each of the through holes 122 on the opposite side to the side of the corresponding connection hole 142, which is secured to the corresponding head portion 158, may be recognized as an example of a first locking surface.

Even in such a configuration, each of the adhesive portions 150 is formed into a rivet shape as a result of including the plurality of first large diameter portions 154 and the second large diameter portion 156, and a plurality of the semiconductor integrated circuit elements 112 to 114 are fixed to one another with the adhesive portions 150, each of which has been formed in a rivet shape. As a result, the strength with which the plurality of semiconductor integrated circuit elements 112 to 114 are fixed to one another may be improved.

In addition, a manufacturing method similar to that of the first embodiment may be employed in the second embodiment. In other words, first, a nozzle 170 is positioned above an opening of one of the through holes 122, which are formed in the upper semiconductor integrated circuit element 112, on the opposite side to the side of the corresponding connection hole 142. Then, the nozzle 170 and the upper and middle semiconductor integrated circuit elements 112 and 113 are relatively brought closer to the lower semiconductor integrated circuit element 114. In a state where the plurality of the semiconductor integrated circuit elements 112 to 114 are superposed with one another, the adhesive, which forms the adhesive portions 150, is applied from the nozzle 170.

Also in this case, once the upper and middle semiconductor integrated circuit elements 112 and 113 and the lower semiconductor integrated circuit element 114 are positioned with respect to one another, the nozzle 170 and the lower semiconductor integrated circuit element 114 are also positioned with respect to each other, and thus, the workload of the positioning process may be reduced.

Also in the second embodiment, each of the first electrodes 120 are arranged coaxially with the corresponding through hole 122, and each of the second electrodes 140 are arranged coaxially with the corresponding connection hole 142. Therefore, the periphery of each of the first electrodes 120 formed in the semiconductor integrated circuit element 112, the periphery of the corresponding first electrode 120 formed in the semiconductor integrated circuit element 113, and the periphery of the corresponding second electrode 140 may be bonded together with the adhesive, which forms the adhesive portions 150 and with which the corresponding through hole 122 formed in the upper semiconductor integrated circuit element 112, the corresponding through hole 122 formed in the semiconductor integrated circuit element 113, and the corresponding connection hole 142 are filled. Thus, the connection state of each of the first electrodes 120 formed in the semiconductor integrated circuit element 112, the corresponding first electrode 120 formed in the semiconductor integrated circuit element 113, and the corresponding second electrode 140 may be stabilized.

Note that, in the above-described second embodiment, the head portions 158 may be omitted.

In the second embodiment, modifications similar to those of the above-described first embodiment may be employed.

When the plurality of semiconductor integrated circuit elements 112 to 114 are superposed with one another, the circumferential edge portion of the opening of each of the through hole 122 formed in the semiconductor integrated circuit element 112 and the circumferential edge portion of the opening of the corresponding through hole 122 formed in the semiconductor integrated circuit element 113 may be fixed to each other by a tentative fixing part 80 similar to that of the above-described first embodiment (see FIG. 6 and FIG. 7). Similarly, the circumferential edge portion of the opening of each of the through holes 122, which are formed in the semiconductor integrated circuit element 113, on the side of the corresponding connection hole 142 and the circumferential edge portion of the opening of the corresponding connection hole 142 on the side of the through hole 122 may be fixed to each other by the tentative fixing part 80.

In addition, in the second embodiment, the upper semiconductor integrated circuit element 112 may be an example of a first member, and each of the middle and lower semiconductor integrated circuit elements 113 and 114 may be an example of a second member. In this case, the following manufacturing method is employed.

In other words, first, the nozzle 170 is positioned above the opening of one of the through holes 122, which are formed in the upper semiconductor integrated circuit element 112, on the opposite side to the side of the corresponding connection hole 142. Then, the nozzle 170 and the upper semiconductor integrated circuit element 112 are relatively brought closer to the middle and lower semiconductor integrated circuit elements 113 and 114. In a state where the plurality of semiconductor integrated circuit elements 112 to 114 are superposed with one another, the adhesive, which forms the adhesive portions 150, is supplied from the nozzle 170.

Also in this case, when the upper semiconductor integrated circuit element 112 and the middle and lower semiconductor integrated circuit elements 113 and 114 are positioned with respect to one another, the nozzle 170 and the middle and lower semiconductor integrated circuit elements 113 and 114 are also positioned with respect to one another, and thus, the workload of the positioning process may be reduced.

Although one aspect of the technique disclosed in the present application has been described above, the technique disclosed in the present application is not limited to the above, and it is obvious that, other than the above, various modifications may be made within the gist of the present application.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   a first member that includes a through hole;
   a second member that includes a connection hole and that is in contact with the first member in a state where the through hole and the connection hole are in communication with each other;
   a first locking surface that is formed on the first member while extending radially outside of the through hole and that faces a side opposite to the connection hole side;
   a second locking surface that is formed in the second member while extending radially outside of the connection hole and that faces a side opposite to the through hole side; and
   an adhesive portion including
      a shaft portion with which the through hole and the connection hole are filled,
      a first large diameter portion that is formed at an end of the shaft portion and secured to the first locking surface, and
      a second large diameter portion that is formed at the other end of the shaft portion and secured to the second locking surface.

2. The electronic device according to claim 1,
   wherein a first electrode is disposed on the first member in such a manner as to be coaxial with the through hole,
   wherein a second electrode is disposed on the second member in such a manner as to be coaxial with the connection hole,
   wherein the adhesive portion has conductivity,
   wherein the first large diameter portion is in contact with the first electrode, and
   wherein the second large diameter portion is in contact with the second electrode.

3. The electronic device according to claim 1,
   wherein the first locking surface is formed in a circumferential edge portion of an opening of the through hole on a side opposite to the connection hole side.

4. The electronic device according to any one of claim 1,
   wherein the first locking surface is formed on an inner wall surface of a transverse groove that extends radially outside of the through hole.

5. The electronic device according to any one of claim 1,
   wherein the second locking surface is formed on an inner wall surface of a transverse groove that extends radially outside of the connection hole.

6. The electronic device according to any one of claim 1,
   wherein a circumferential edge portion of an opening of the through hole on the connection hole side is fixed to a circumferential edge portion of an opening of the connection hole on the through hole side with a fixing part.

7. The electronic device according to claim 6,
wherein the fixing part is formed by anodic bonding.

8. The electronic device according to claim 7,
wherein the fixing part is another adhesive portion different from the adhesive portion.

9. The electronic device according to claim 8,
wherein the other adhesive portion has a viscosity lower than a viscosity of the adhesive portion in a state of being uncured.

10. The electronic device according to claim 8,
wherein the other adhesive portion has an insulating property.

11. The electronic device according to claim 1,
wherein the first member is a piezoelectric vibrating reed, and
wherein the second member is a package.

12. The electronic device according to claim 11,
wherein a base member of the second member is made in such a manner as to be transparent.

13. The electronic device according to claim 1,
wherein the number of the first member is more than one,
wherein a plurality of the first numbers are superposed with each other in such a manner that a plurality of the through holes are in communication with each other, and
wherein the second member is superposed with the plurality of first members in a state where the connection hole and the plurality of through holes are in communication with one another.

14. The electronic device according to claim 13,
wherein the plurality of first members and the second member are semiconductor integrated circuit elements.

15. A method of manufacturing the electronic device according to claim 1, the method comprising:
positioning a nozzle that supplies an adhesive at an opening of a through hole on a side opposite to a connection hole;
bringing a first member and a second member into contact with each other in such a manner that the through hole and the connection hole are in communication with each other by relatively bringing the nozzle and the first member closer to the second member;
injecting the adhesive into the through hole and the connection hole from the nozzle via the opening of the through hole on the side opposite to the connection hole side; and
forming a shaft portion, a first large diameter portion, and a second large diameter portion each of which is formed of the adhesive by curing the adhesive.

* * * * *